US006280319B1

(12) United States Patent
Wong et al.

(10) Patent No.: US 6,280,319 B1
(45) Date of Patent: Aug. 28, 2001

(54) HIGH AVAILABILITY AIRFLOW MANAGEMENT SYSTEM FOR USE IN ELECTRONIC EQUIPMENT

(75) Inventors: Henry Wong, Tempe; John Gatti, Scottsdale, both of AZ (US)

(73) Assignee: Motorola, Inc., Schaumburg, IL (US)

( * ) Notice: Subject to any disclaimer, the term of this patent is extended or adjusted under 35 U.S.C. 154(b) by 0 days.

(21) Appl. No.: 09/577,892

(22) Filed: May 24, 2000

(51) Int. Cl.[7] .................................................. H05K 5/00
(52) U.S. Cl. .................... 454/184; 415/211.2; 454/258
(58) Field of Search .................... 454/184, 258, 454/261, 284, 307, 329; 415/211.2, 220, 221

(56) References Cited

U.S. PATENT DOCUMENTS

| 4,399,485 | 8/1983 | Wright et al. ................. 361/383 |
| 4,730,233 | 3/1988 | Osterman ..................... 361/383 |
| 5,432,674 | 7/1995 | Hardt ........................... 361/694 |
| 5,463,967 | * 11/1995 | Gielow et al. ............. 110/104 R |
| 5,544,012 | * 8/1996 | Koike ........................... 361/695 |
| 5,772,500 | * 6/1998 | Harvey et al. ................ 454/184 |
| 6,018,458 | 1/2000 | Delia et al. .................. 361/690 |
| 6,104,607 | * 8/2000 | Behl ............................. 361/687 |
| 6,108,203 | * 8/2000 | Dittus et al. ................. 361/695 |
| 6,154,368 | * 11/2000 | Scofield ....................... 361/719 |

* cited by examiner

Primary Examiner—Harold Joyce
Assistant Examiner—Derek S. Boles
(74) Attorney, Agent, or Firm—Jeff D. Limon; S. Kevin Pickens

(57) ABSTRACT

A cooling fan (FIG. 1, 100) generates an air current, which includes a substantial swirl component, along a first direction (10). When the air current reaches the first plate (120), which is predominantly perpendicular to the direction of the airflow, a portion of the air current is routed toward a second direction (20) which is perpendicular to the first direction (10) thereby providing airflow to electronic equipment along the second direction (20). A second portion of the air current is routed towards a direction to the opposite of second direction (20) by way of a second plate (150) which lies along the second direction (20) and is tilted in an upward direction. Additionally, the second plate (150) includes narrow and wide end portions (152 and 154, respectively) which serves to direct a portion of the air current opposite that of the second direction (20).

18 Claims, 4 Drawing Sheets

HIGH AVAILABILITY AIRFLOW MANAGEMENT SYSTEM FOR USE IN ELECTRONIC EQUIPMENT

FIELD OF THE INVENTION

The invention relates generally to the field of electronic equipment and, more particularly, to high availability systems for managing airflow within electronic equipment.

BACKGROUND OF THE INVENTION

In many types of electronic equipment, fans are used for cooling by way of blowing air over the electronics, thereby dissipating the excess heat generated by the electronics. Through proper sizing of the fan and flow control of the air driven by the fan, the electronic equipment can be maintained at a stable operating temperature even though ambient air temperatures may be quite high.

In many applications, however, the cooling fan represents one of the least reliable components used in an electronic system due to its primarily mechanical nature. In high availability electronic equipment, the cooling system must be further enhanced in order to increase its reliability. In one design technique, redundant fans are used in order to provide a backup cooling system when the primary cooling system fails. However, in order to maintain adequate airflow after the failure of a cooling fan, complete redundancy is required, thus increasing the cost, required space, and complexity of the of the electronic equipment.

Thus, it is highly desirable to make use of an airflow management system for use in high availability electronic equipment that does not require complete redundancy in cooling components while still maintaining adequate cooling after the failure of a cooling fan.

BRIEF DESCRIPTION OF THE DRAWINGS

The invention is pointed out with particularity in the appended claims. However, a more complete understanding of the present invention may be derived by referring to the detailed description and claims when considered in connection with the figures, wherein like reference numbers refer to similar items throughout the figures, and:

DESCRIPTION OF THE PREFERRED EMBODIMENTS

A high availability airflow management system for use in a electronic system provides the functionality of the redundant airflow without requiring complete redundancy in the cooling system. The unique design of the first and second plates which deflect air flow in substantially opposite directions allows for the adequate cooling of electronic equipment after one of at least two cooling fans experiences a reduction in airflow capability. This results in an efficient use of cooling resources, thus reducing the overall cost, required space, and complexity of high availability electronic equipment.

Figure 1:
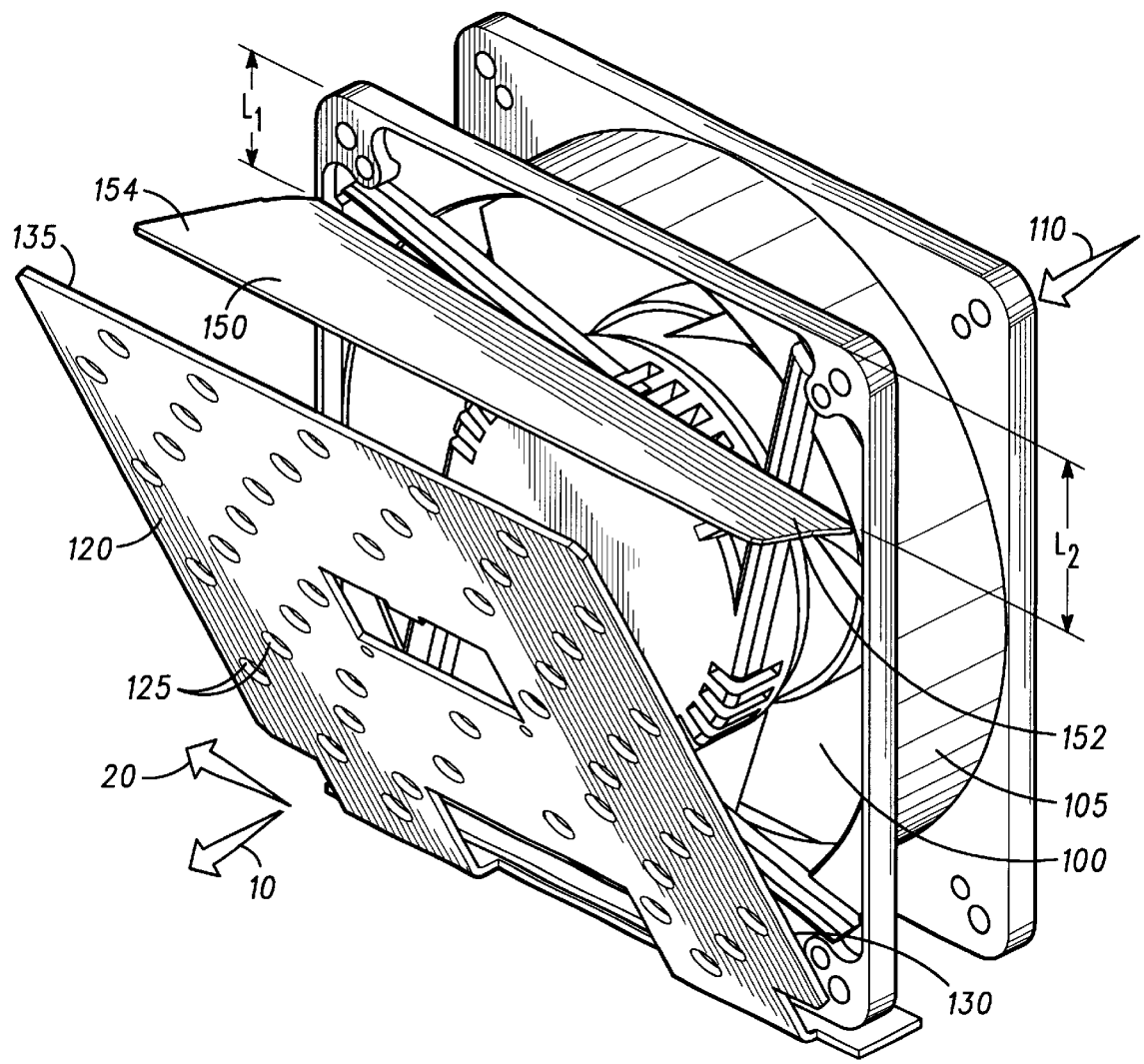
FIG. 1 is a rear isometric view of a high availability airflow management system for use in electronic equipment in accordance with a preferred embodiment of the invention.

FIG. 1 is a frontal isometric view of a high availability airflow management system for use in electronic equipment in accordance with a preferred embodiment of the invention. In FIG. 1, outside air 110 is drawn through fan 100 toward first plate 120 and second plate 150. Fan 100 can be any type of air driving element, but is preferably a rotary blade tube axial fan which produces a swirl, or rotational, component to the motion of the air currents generated by the action of the rotating blades. Additionally, fan 100 incorporates housing 105 which serves to hold the fan motor and provides a method of mounting the fan. For the purposes of this exemplary embodiment, fan 100 rotates in a counterclockwise direction when viewed from the front of the fan.

Air current generated by fan 100 travels within the confines of housing 105 along first direction 10 toward first plate 120. Preferably, first plate 120 is oriented in a plane which is predominantly perpendicular to first direction 10, and inclined along a direction parallel to first direction 10. The inclination of first plate 120 produces a shallow end portion 130 near the bottom of first plate 120, and produces a deep end portion 135 towards the top of first plate 120 of FIG. 1.

In FIG. 1, first plate 120 includes perforations 125. These perforations allow a portion of airflow of the air current to be conveyed through first plate 120. This allows cooling of electronic or other equipment placed behind first plate 120. The size, shape, and number of perforations 125 are determined by the cooling needs of any equipment placed behind first plate 120. It should be noted that these perforations 125 are optional and that the principles of the invention may be practiced without perforations 125 being included in first plate 120.

When the air current from fan 100 is incident upon first plate 120, the portion of the air current near shallow end portion 130 is routed along a second direction (20), which is substantially perpendicular to first direction 10. This allows equipment placed along second direction 20 to receive cooling air as required to ensure a stable operating temperature. In general, the particular angle of inclination of first plate 120 (shown in greater detail in FIG. 2, herein) is arrived at through experimentation in order to determine the specific amount of airflow which is conveyed along second direction 20. Additionally arrived at through experimentation, is the specific distance of shallow end portion 130 to fan 100. It is anticipated that a different choice of air driving element other than a tube axial rotary blade fan, such as fan 100, will impact this distance.

Second plate 150 is shown in FIG. 1 as being attached to housing 105, although this particular attachment method is not necessary to practice the invention. Thus, if desired, second plate 150 can be attached to a shroud or housing which surrounds fan 100. Second plate 150 includes both narrow end portion 152, and wide end portion 154. (The dimensions of the narrow and wide end portions 152 and 154, respectively, are shown in greater detail in FIG. 3.) Additionally, second plate 150 is tilted upward along second direction 20 so that wide end portion 154 is further from the center of rotation of fan 100 than narrow end portion 152. In FIG. 1, this difference is manifested in distance L1, measured from wide end portion 154 to a line parallel with the top of housing 105, and distance L2, measured from wide end portion 154 to a line parallel with the top of housing 105. This upward tilt, when combined with narrow end portion 152 and wide end portion 154 serve to route a portion of the air current in a direction opposite second direction 20. This allows the equipment lying opposite of second direction 20 to receive a portion of the air current generated by fan 100. As is the case with the particular angle of inclination of first plate 120, the particular tilt angle and widths of narrow end portion 152 and wide end portion 154 of second plate 150 determine the amount of the air current from fan 100 which is directed opposite second direction 20.

In addition to generating airflow along direction 20 and opposite to direction 20, first and second plates 120 and 150 also serve to generate airflow in substantially radial directions characterized by divergence from the center of fan 100. This distribution of airflow in a radial direction enhances the cooling capability of the high availability airflow management system of FIG. 1.

Figure 2:
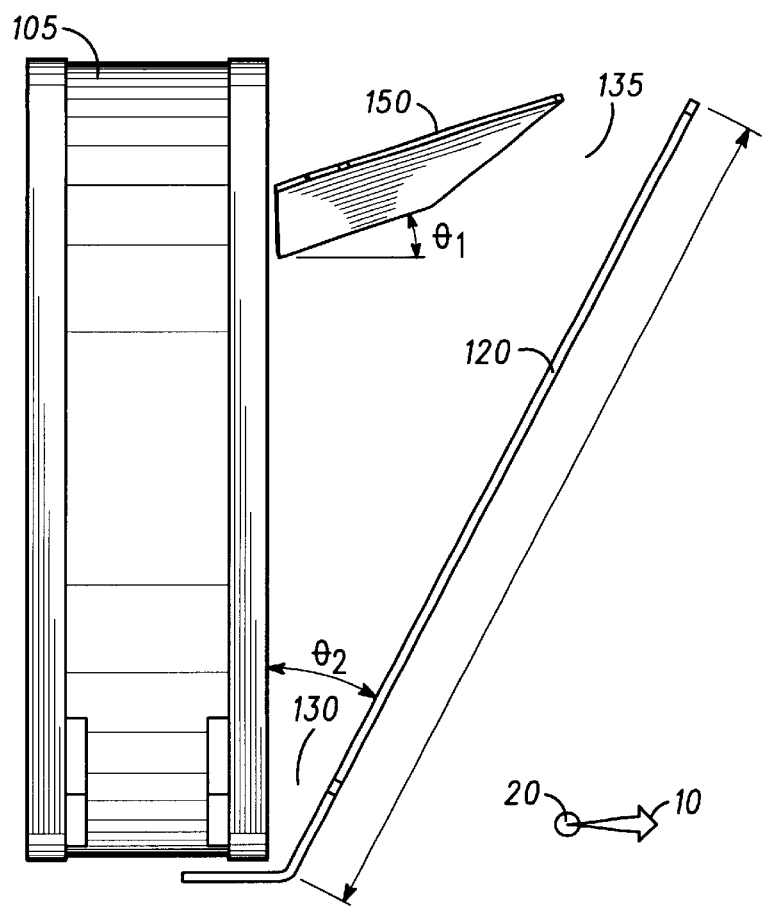
FIG. 2 is a side view of a high availability air flow management system for use in electronic equipment in accordance with a preferred embodiment of the invention.

FIG. 2 is a side view of a high availability airflow management system for use in electronic equipment in accordance with a preferred embodiment of the invention. In FIG. 2, deep end portion 135 and shallow end portion 130 are clearly seen. Additionally, the angle of inclination ($\theta_1$) of first plate 120 in a direction parallel to first direction 10 is also apparent. In a similar manner, the angle of inclination ($\theta_2$) of second plate 150 in a direction parallel to first direction 10 is apparent as well. Further, the length of first plate 120, as denoted by L3 is also clearly seen.

Figure 3:
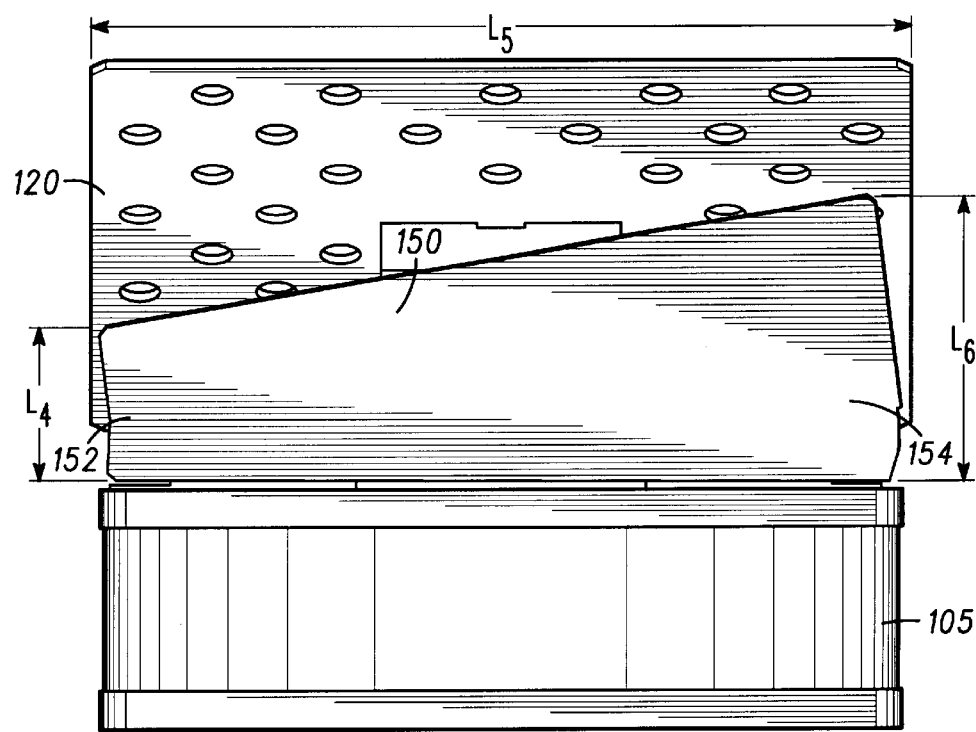
FIG. 3 is a top view of a high availability air flow management system for use in electronic equipment in accordance with a preferred embodiment of the invention.

FIG. 3 is a top view of a high availability air flow management system for use in electronic equipment in accordance with a preferred embodiment of the invention. In FIG. 3, the width of narrow end portion 152, as denoted by L4, as well as the width of wide end portion 154, as denoted by L6, are clearly seen. Further, the width of first plate 120, denoted by L5, can also be easily seen.

Figure 4:
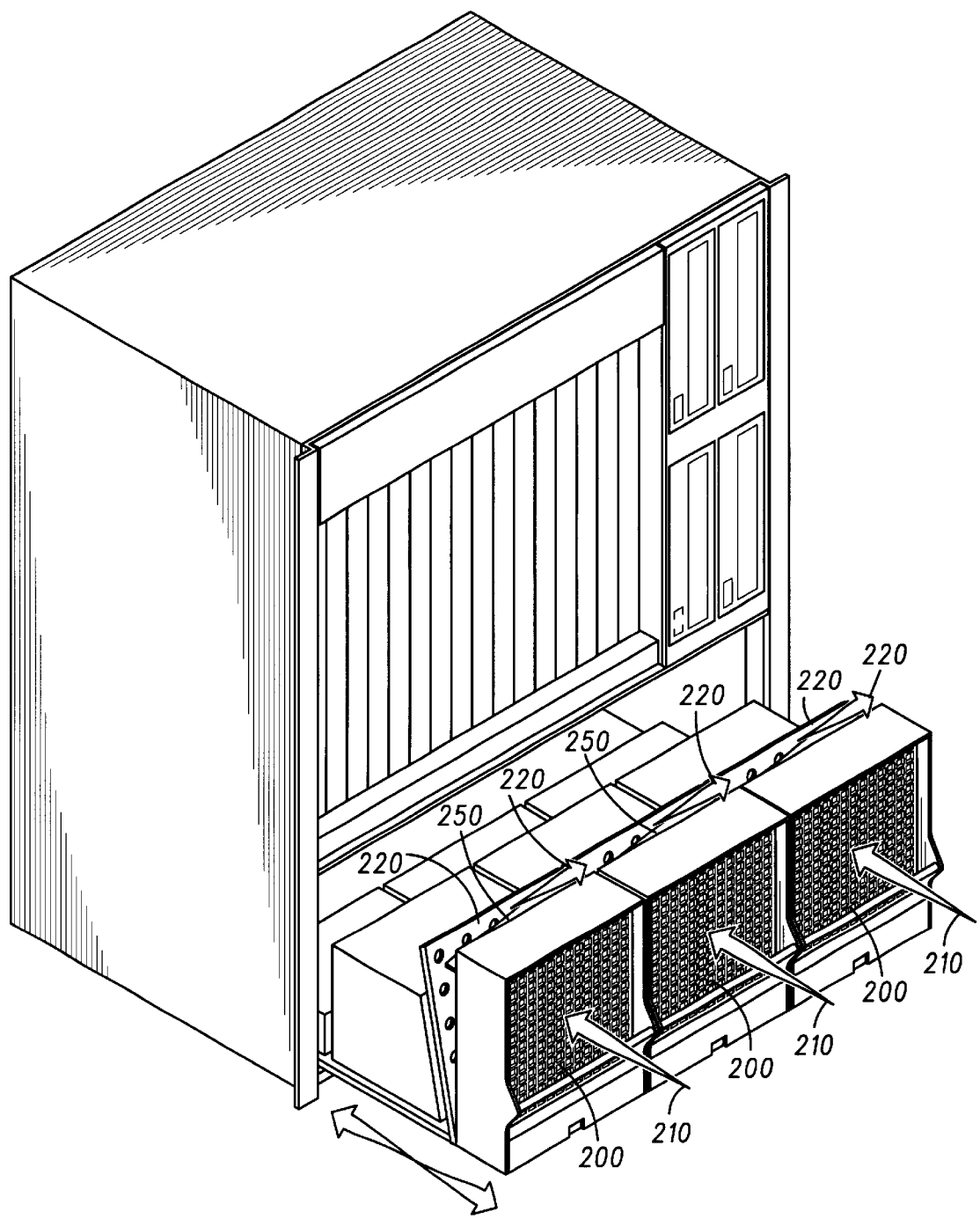
FIG. 4 is an isometric view of a complementary high availability air flow management system for use in a electronic system in accordance with a preferred embodiment of the invention.

FIG. 4 is an isometric view of a complementary high availability air flow management system for use in an electronic system in accordance with a preferred embodiment of the invention. In FIG. 4, air driving elements 200 are placed in a side by side arrangement. Preferably, each of air driving elements 200 operates in a manner similar to fan 100 of FIGS. 1–3.

In FIG. 4, each of air driving elements 200 generates an air current which is conveyed through each of housings 205 along a corresponding one of first axes 210. As each air current propagates along a corresponding one of first axes 210, each air current is incident upon a corresponding one of first plates 240. In a manner similar to that of FIGS. 1–3, a portion of the air current from each of air driving elements 200 is routed along second axes 220 by each of first plates 240. Also as described in reference to FIGS. 1–3, each of first plates 240 is arranged substantially perpendicular to each corresponding one of first axes 210 and inclined toward a direction parallel to each one of first axes 210. Through this inclination, the direction of propagation of the air current from each of air driving elements 200 is changed to coincide with the direction of second axes 220. Preferably, second axes 220 are substantially perpendicular to first axes 210.

Mounted to each of housings 205 of FIG. 4 is one of second plates 250. In a manner similar to that of FIGS. 1–3, each of second plates 250 incorporates a wide and narrow end, with each of plates 250 being tilted slightly upward along the direction of second axes 220. These characteristics of each of second plates 250 cause a portion of the air current generated by air driving elements 200 to be routed in a direction opposite that of second axes 220.

From FIG. 4, it can be seen that each of air driving elements 200 generates an air flow in the direction of second axes 220, as well as a direction opposite that of second axes 220. Through this generation of opposite air currents, a failure or other degradation in the performance of each of air driving elements 200 can be compensated for by one or more of air driving elements 200. Thus, in the event that one of air driving elements 200 no longer produces an appreciable air flow, the arrangement of first plate 120 and second plate 150 of FIG. 1 ensures that cooling air is distributed to those areas previously cooled by the failed one or more of air driving elements 200. Additionally, the performance of the remaining units of air driving elements 200 can be incrementally increased in order to compensate for lost airflow produced by the failed unit. This allows the complementary airflow management system of FIG. 4 to produce an amount of airflow comparable to the airflow provided prior to the occurrence of the failure, thereby ensuring a stable operating temperature of the electronic equipment.

Although the examples of FIGS. 1–4 are explained in terms of a system which makes use of ambient air, it should be understood that the performance of the present invention is not degraded by the use of another type of compressible fluid such as a noble gas. Further, nothing prevents the practice of the present invention using a mixture of air and one or more other type of compressible fluid.

A specific working example, which incorporates many of the broad principles of the invention, has been built and tested. In this example, distances L1 and L2 of FIG. 1 are approximately equal to 2 cm (0.8 inches) and 3 cm (1.2 inch), respectively. From FIG. 2, L3 is approximately equal to 14 cm (5.5 inches), $\theta_1$ is approximately equal to 60 degrees, and $\theta_2$ is approximately equal to 19 degrees. From FIG. 3, distance L4 is approximately equal to 2.5 cm (1 inch), distance L5 is approximately equal to 13 cm (5.1 inches), and distance L6 is approximately equal to 4.6 cm (1.8 inch). The example makes use of a rotary tube axial fan which rotates in the clockwise direction when viewed from the rear, as in FIG. 1. With the direction of rotation being clockwise, a portion of the air current is directed along direction 20 and in a direction opposite to direction 20. Three substantially identical airflow management systems built consistent with these dimensions have been constructed and integrated in to the complementary airflow management system of FIG. 4.

Figure 5:
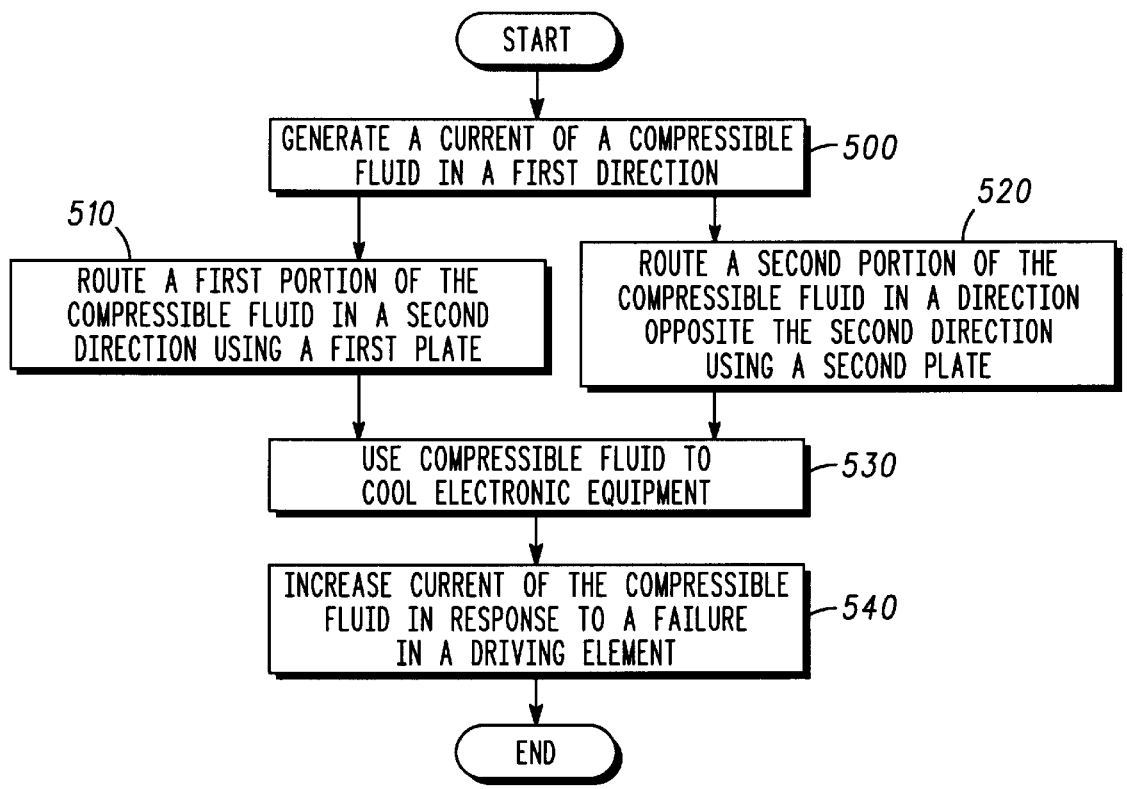
FIG. 5 is a flowchart for a method implemented by a complementary high availability air flow management system for use in an electronic system in accordance with a preferred embodiment of the invention.

FIG. 5 is a flowchart for a method implemented by a high availability airflow management system for use in an electronic system in accordance with a preferred embodiment of the invention. The apparatus of FIGS. 1–3 is suitable for performing the method. FIG. 5 begins at step 500 where a current of a compressible fluid is generated and conveyed in a first direction. The method continues at step 510 where a first portion of the compressible fluid is routed toward a second direction using a first plate. It is anticipated that the first plate is oriented in a plane which is predominantly perpendicular to the first direction and inclined along the first direction.

Concurrent with step 510, step 520 is executed wherein a second portion of the compressible fluid is routed in a direction opposite the second direction. Step 520 preferably includes the use of a second plate, detached from the first plate, and oriented substantially parallel to the second direction. At step 530, the first and second portions of the compressible fluid flow in the direction of electronic equipment, resulting in cooling of the equipment. At step 540, a current of the compressible fluid generated by a driving element is increased in response to a failure in a second driving element. The method ends after the completion of step 540.

A high availability airflow management system for use in an electronic system provides redundant airflow without requiring complete redundancy in the cooling system. The unique design of the first and second plates which deflect air flow in substantially opposite directions allows for the adequate cooling of electronic equipment after one or more of a group of cooling fans experiences a reduction in airflow capability. This results in an efficient use of cooling resources, and thus reduces the overall cost, space, and complexity of high availability electronic equipment. The design also results in weight and volume savings which provide further advantages of the invention over competing designs.

Accordingly, it is intended by the appended claims to cover all modifications of the invention that fall within the true spirit and scope of the invention.

What is claimed is:

1. A system for managing airflow, comprising:
   a first plate being oriented in a plane which is predominantly perpendicular to a first direction of said airflow and inclined along said first direction parallel to said airflow to form a shallow end portion and a deep end portion, said first plate deflecting a portion of said airflow in a second direction substantially perpendicular to said first direction; and
   a second plate being proximate said deep end portion and oriented along said second direction, said second plate deflecting a portion of said airflow in a direction substantially opposite said second direction, said second plate being predominantly parallel to said first direction.

2. The system of claim 1 wherein said first plate is perforated in order to allow a portion of said airflow to be conveyed through said first plate.

3. The system of claim 1 wherein said shallow end portion and said deep end portion are located at opposite ends of said first plate.

4. The system of claim 1 additionally comprising a fan which brings about said airflow.

5. The system of claim 4, wherein said second plate is tilted along said second direction and includes a narrow end portion and a wide end portion, said narrow end portion being closer to an axis of rotation of said fan than a wide end portion of said second plate.

6. The system of claim 1, wherein said second plate is attached to a housing which surrounds a fan which produces said airflow.

7. The system of claim 1, further comprising a housing to which said second plate is mounted.

8. The system of claim 1, wherein said second plate includes a narrow end portion and a wide end portion opposite said narrow end portion, said wide end portion being located opposite said narrow end portion along said second direction.

9. A complementary airflow management system for use in a high availability electronic system, comprising:

a plurality of air driving elements, each of said plurality of air driving elements producing an air current along a corresponding first axis;
   a first plurality of plates corresponding to each of said plurality of air driving elements, wherein each of said first plurality of plates is arranged substantially perpendicular to said corresponding first axis and inclined toward a direction parallel to said corresponding first axis, each of said first plurality of plates changing a direction of each air current to coincide with a second axis, said second axis being substantially perpendicular to said corresponding first axis; and
   a second plurality of plates corresponding to each of said plurality of air driving elements, said second plurality of plates being arranged in a direction predominantly parallel to said second axis and changing said air current to a direction opposite said second axis.

10. The complementary airflow management system of claim 9 additionally comprising a plurality of housings, wherein each of said plurality of housings is coupled to a corresponding one of said plurality of air driving elements, said plurality of housings controlling the spreading of said air current.

11. The complementary airflow management system of claim 9, wherein each of said plurality of air driving elements is a rotary blade fan.

12. The complementary airflow management system of claim 11, wherein each of said rotary blade fans is placed in a side-by-side arrangement.

13. The complementary airflow management system of claim 9, wherein each of said first plurality of plates is perforated in order to allow a portion of said air current to be present behind each of said first plurality of plates.

14. The complementary airflow management system of claim 9, wherein each of said second plurality of plates is predominantly parallel to said first axis.

15. A method for managing airflow in high availability electronic system, comprising the steps of:
   generating, in a first direction, a current of a compressible fluid using a driving element;
   routing a first portion of said compressible fluid in a second direction using a first plate, said first plate being oriented in a plane which is predominantly perpendicular to said first direction and included along said first direction; and
   routing a second portion of said compressible fluid in a direction opposite said second direction using a second plate, said second plate being detached from said first plate and oriented substantially parallel to said second direction.

16. The method of claim 15, further comprising the step of said first and second portions of said compressible fluid cooling electronic equipment.

17. The method claim 15, further comprising the step of increasing said current of said compressible fluid in response to a failure of a second driving element.

18. The method of claim 15, further comprising the step of directing said compressible fluid toward electronic equipment previously cooled by a second driving element in response to a failure of said second driving element.

* * * * *